US006983010B1

(12) United States Patent
Sim et al.

(10) Patent No.: US 6,983,010 B1
(45) Date of Patent: Jan. 3, 2006

(54) HIGH FREQUENCY EQUALIZER USING A DEMULTIPLEXING TECHNIQUE AND RELATED SEMICONDUCTOR DEVICE

(75) Inventors: Jae-yoon Sim, Kyungki-do (KR); Hong-joon Park, Kyungsangbuk-do (KR); Soo-in Cho, Seoul (KR); Jung-bae Lee, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 09/542,042

(22) Filed: Mar. 31, 2000

(30) Foreign Application Priority Data

May 4, 1999 (KR) .............................. 1999-16006

(51) Int. Cl.
*H03H 7/30* (2006.01)
(52) U.S. Cl. ..................................... 375/229
(58) Field of Classification Search ................ 375/229, 375/354, 371, 373, 375, 376; 377/104, 106; 370/216; 327/1
See application file for complete search history.

(56) References Cited

U.S. PATENT DOCUMENTS 4,181,822 A * 1/1980 Workman .................... 704/201
5,778,055 A * 7/1998 Paneth et al. ............. 379/93.31
5,841,841 A * 11/1998 Dodds et al. ............. 379/93.08

OTHER PUBLICATIONS

Hirotaka Tamura et al., "PRD-Based Global-Mean-Time Signaling for High-Speed Chip-to-Chip Communications," 1998 IEEE International Solid-State Circuits Conference (ISSCC98), Session 10, Paper FA 10.5, (Digtest of Technical Papers, pp. 164-165), Feb. 6, 1998.
Digest of Technical Papers, ISSCC98, Feb. 6, 1998, p. 165.

* cited by examiner

*Primary Examiner*—Mohammed Ghayour
*Assistant Examiner*—Pankaj Kumar
(74) *Attorney, Agent, or Firm*—Volentine, Francos & Whitt, PLLC

(57) ABSTRACT

A high frequency equalizer using a demultiplexing technique and a semiconductor device using the same are provided. The high frequency equalizer demultiplexes input data input through an input and output terminal into a plurality of input data items, each having a time difference that is the same as the period of the input data. The equalizer restores the lost high frequency data components of the plurality of demultiplexed input data items, multiplexes the restored plurality of data items, and sequentially outputs the restored data items one by one. Therefore, using this high frequency equalizer, it is possible to allow enough time to restore the lost high frequency component even though the period of the input data is reduced by an increase of the data transmission speed. Using this high frequency equalizer, it is possible to correctly restore the lost high frequency component even at a high data transmission speed. Therefore, according to the semiconductor device including the high frequency equalizer, the lost high frequency component of data can be restored even at a high data transmission speed.

20 Claims, 9 Drawing Sheets

US 6,983,010 B1

HIGH FREQUENCY EQUALIZER USING A DEMULTIPLEXING TECHNIQUE AND RELATED SEMICONDUCTOR DEVICE

This application relies for priority upon Korean Patent Application No. 99-19006, filed on May 4, 1999, the contents of which are herein incorporated by reference in their entirety.

BACKGROUND OF THE INVENTION

The present invention relates to a semiconductor device. More particularly, the present invention relates to a high frequency equalizer using a demultiplexing technique and a related semiconductor device.

As the clock signal frequency of central processing units (CPUs) significantly increases, the bandwidth of memory devices required by a system must also increase. In order to increase the bandwidth of memory devices, the synchronous DRAM (SDRAM) has been developed.

In addition, as semiconductor device manufacturing processes become more advanced, system performance is restricted by the data transmission speed between semiconductor devices, for example, between the DRAM and the CPU, rather than by semiconductor device speed.

Therefore, the joint electronic device engineering council (JEDEC) standard for a stub series-terminated transceiver logic (SSTL) method has been provided for increasing the data transmission speed between a DRAM and a CPU. In the SSTL method, speed is increased by impedance matching a transmission line, i.e., a bus, in order to reduce reflected waves, which are generated when a conventional low voltage TTL (LVTTL) method is used. However, in the SSTL method, power consumption is increased by the existence of a resistance required for impedance matching. Also, it is difficult to perform data processing with a high speed CPU without experiencing a bottleneck phenomenon.

Therefore, a Rambus method, where the input and output circuits of the DRAM and a bus system are changed in order to increase data transmission speed between the DRAM and the CPU, has been recently provided. However, as the number of DRAMs connected to the bus increases in the Rambus method, the parasitic load of the bus similarly increases. Accordingly, the frequency bandwidth of the bus is restricted, thus restricting the transmission speed of the bus. Therefore, the high frequency component of the data transmitted through the bus is lost. In order to solve such a problem, a method of restoring the lost high frequency component of the data at a receiver has been provided.

FIG. 1 is a schematic block diagram of a conventional high frequency component restoring apparatus. FIG. 2 is a graph showing a signal transient response characteristic of a channel for describing the conventional high frequency restoring apparatus shown in FIG. 1.

Referring to FIG. 1, the conventional high frequency component restoring apparatus includes an input port 11, an output port 12, a plurality of delayers 13 through 16, a plurality of multipliers 17 through 20, an adder 21, and a voltage comparator 22. The input port 11 receives current input data $V_{in}$ transmitted through a channel whose frequency bandwidth is restricted, i.e., a bus. The output port 12 outputs output data $D_{in}$, which has its lost high frequency component restored. The delayers 13 through 16 retain the input data of a previous period of time. The multipliers 17 through 20 obtain fluctuation values caused by interference signals $a_1$ through $a_4$ of the input data of the previous period of time. The adder 21 subtracts these fluctuation values from the current input data $V_{in}$. And the voltage comparator 22 compares the output signal of the adder 21 with a predetermined value.

In operation, when a predetermined pulse signal IP is transmitted through a channel whose frequency bandwidth is restricted, and is input to the input port 11 as shown in FIG. 2, various responses are included in the current input data $V_{in}$ input through the input port 11. In particular, when the level of the input data $V_{in}$ is "1" after one period T (See FIG. 2), the influence of this "1" is continuously experienced. In other words, after a period 2T, an interference signal $a_1$ is experienced; after 3T, an interference signal $a_2$ is experienced; after 4T, an interference signal $a_3$ is experienced; and after 5T, an interference signal $a_4$ is experienced. Accordingly, the interference signals $a_1$ through $a_4$ affect the next input data. The high frequency component of the input data is lost, but it is possible to correctly determine the next input data and to restore the high frequency component after removing the influence of the interference signals.

Therefore, in the high frequency component restoring apparatus according to the conventional technology, the fluctuation values due to the interference signals $a_1$ through $a_4$ are obtained by retaining the input data of the previous period of time by using the delayers 13 through 16 and multiplying the input data of the previous period of time, i.e., the output signals of the delayers 13 through 16, by the interference signals $a_1$ through $a_4$ of the input data of the previous period of time using the multipliers 17 through 20. Then, the influence of the interference signals is removed by subtracting the fluctuation values caused by the interference signals $a_1$ through $a_4$ of the input data of the previous period of time, i.e., the output signals of the multipliers 17 through 20, from the current input data $V_{in}$ using the adder 21. Accordingly, the lost high frequency component of the current input data $V_{in}$ is restored and the restored input data $D_{in}$ is then output from the voltage comparator 22.

However, in the conventional apparatus and method for restoring high frequency component, the amount of time assigned to restore the high frequency component is equal to the period of the input data. Therefore, when the data transmission speed increases, thus reducing the period of the input data, the amount of time assigned to restore the high frequency component is also shortened. Unfortunately, the lost high frequency component cannot be correctly restored at a high transmission speed. Also, in the conventional apparatus and method for restoring the high frequency component, a demultiplexing method of arranging a plurality of circuits shown in FIG. 1 in parallel to process input data, for solving the above problem cannot be applied.

SUMMARY OF THE INVENTION

It is an object of the present invention to provide a high frequency component restoring circuit, i.e., a high frequency equalizer capable of assigning enough time for restoring a lost high frequency component and of correctly restoring the lost high frequency component at a high data transmission speed by applying a demultiplexing method.

It is another object of the present invention to provide a semiconductor device capable of performing high speed data transmission between chips by correctly restoring the lost high frequency component at a high data transmission speed.

To achieve the first object, a high frequency equalizer is provided, comprising a restoring circuit for demultiplexing input data into a plurality of input data items each having a time difference the same as period of the input data, restoring lost high frequency components of the plurality of demultiplexed input data items, and outputting restored input data items in response to restoring clock signals, and a multiplexer for multiplexing the restored input data items and sequentially outputting multiplexed data items one by one as restored input data, in response to the restoring clock signals.

The restoring circuit may comprises a demultiplexer for demultiplexing the input data into the plurality of input data items in response to the restoring clock signals, and a plurality of unit restoring circuits operating in response to the corresponding restoring clock signal, for receiving current input data items of a current time and previous input data of a previous period of time, restoring the lost high frequency component of the current input data item, and outputting restored input data items.

The unit restoring circuit may comprise a restoring cell for receiving the current input data item and the previous input data item and restoring the lost high frequency component of the current input data item to form an intermediate input data item, and a latch circuit for storing and amplifying the intermediate input data item in response to the corresponding restoring clock signal and outputting the amplified intermediate data item as a restored input data item.

The restoring cell may comprise a regular current source for supplying a first source current, a compensation current source for providing a second source current; a first current amplifying circuit for amplifying the first source current in response to the current input data item and a reference voltage, a second current amplifying circuit for amplifying the second source current in response to the previous input data item and the reference voltage, a first current output transistor commonly connected to a first output terminal of the first current amplification circuit and to a second output terminal of the second current amplification circuit, for outputting a current proportional to the difference between the currents output first and second output terminals, and a second current output transistor commonly connected to a third output terminal of the first current amplifying circuit and a fourth output terminal of the second current amplifying circuit, for outputting a current proportional to the difference between the currents output from the third and fourth output terminals.

The latch circuit may comprise a first switching unit for transmitting the intermediate data item from the restoring cell in response to the corresponding restoring clock signal, a first latch for amplifying and storing the intermediate input data item as a first stored data item, a second switching unit for transmitting the first stored data item in response to an inverted clock signal of the corresponding restoring clock signal, and a second latch for amplifying and storing the first stored data item as a second stored data item, and outputting the second stored data item as a restored input data item.

To achieve the second object, a semiconductor device is provided, comprising an output clock signal generator for receiving a first system clock signal and generating an output clock signal having a frequency n times the frequency of the first system clock signal, where n is an integer, an output driver for synchronizing output data with the output clock signal and outputting the synchronized output data through an input and output terminal, a restoring clock signal generator for receiving a second system clock signal and generating a plurality of restoring clock signals having the same frequency as the frequency of the second system clock signal and each having different phases, and a high frequency equalizer for restoring lost high frequency components of input data input through the input and output terminal in response to the restoring clock signals and outputting the restored input data.

The output clock signal generator preferably comprises a phase locked loop circuit, and the restoring clock signal generator preferably comprises a PLL circuit.

The high frequency equalizer may comprise a restoring circuit operating in response to the restoring clock signals, for demultiplexing the input data into a plurality of input data items each having a time difference the same as a period of the input data, restoring the lost high frequency components of the plurality of demultiplexed input data items, and outputting the restored input data items, and a multiplexer operating in response to the restoring clock signals, for multiplexing the restored input data items of the restoring circuit and sequentially outputting the multiplexed data items one by one as restored input data.

The restoring circuit may comprise a demultiplexer for demultiplexing the input data into the plurality of input data items, and a plurality of unit restoring circuits, each operating to receive a current input data item of a current period of time and a previous input data item of a previous period of time from among the plurality of input data items, restoring the lost high frequency component of the current input data item to form a restored input data item, and outputting the restored input item in response to a corresponding one of the restoring clock signals.

Each of the unit restoring circuits may comprise a restoring cell for receiving the current input data item the previous input data item and restoring the lost high frequency component of the current input data to form an intermediate input data item, and a latch circuit operating in response to the corresponding restoring clock signal, for storing and amplifying the intermediate input data item, and outputting the amplified intermediate input data item as the restored input data item.

The restoring cell may comprise a regular current source for supplying a first source current, a compensation current source for providing a second source current, a first current amplifying circuit for amplifying the first source current in response to the current input data item and a reference voltage, a second current amplifying circuit for amplifying the second source current in response to the previous input data item and the reference voltage, a first current output transistor commonly connected to a first output terminal of the first current amplifying circuit and a second output terminal of the second current amplifying circuit, for outputting a first comparison current proportional to the difference between the currents output from the first and second output terminals, and a second current output transistor commonly connected to a third output terminal of the first current amplifying circuit and a fourth output terminal of the second current amplifying circuit, for outputting a second comparison current proportional to the difference between the currents output from the third and fourth output terminals.

The second source current is preferably equal to the first source current times an interference signal of the previous input data item.

The latch circuit may comprise a first switching unit for transmitting the output of the restoring cell in response to the corresponding restoring clock signal, a first latch for amplifying and storing the output of the restoring cell transmitted through the first switching unit as a first stored data item, a second switching unit for transmitting the first stored data item in response to an inverted clock signal of the corresponding restoring clock signal and a second latch for amplifying and storing the first stored data item transmitted through the second switching unit as a second stored data item, and outputting the second stored data item as the restored input data item.

The semiconductor device may further comprise an inner clock signal generator for receiving one of the plurality of restoring clock signals and generating an internal clock signal having a frequency equal to m times the frequency of the received restoring clock signal, wherein m is an integer.

A unit restoring circuit is also provided, comprising a regular current source for supplying a first source current, a compensation current source for providing a second source current, a first current amplifying circuit for amplifying the first source current in response to a current input data item and a reference voltage, a second current amplifying circuit for amplifying the second source current in response to a previous input data item and the reference voltage, a first current output transistor commonly connected to a first output terminal of the first current amplifying circuit and a second output terminal of the second current amplifying circuit, for outputting a first difference current proportional to the difference between the currents output from the first and second output terminals; and a second current output transistor commonly connected to a third output terminal of the first current amplifying circuit and a fourth output terminal of the second current amplifying circuit, for outputting a second difference current proportional to the difference between the currents output from the third and fourth output terminals.

The first current amplifying circuit may comprise a first PMOS transistor having a first source connected to the current source, a first gate connected to the current input data item, and a first drain connected to the first current output transistor and forming the first output terminal, and a second PMOS transistor having a second source connected to the current source, a second gate connected to the reference voltage, and a second drain connected to the second current output transistor and forming the third output terminal.

The second current amplifying circuit may comprise a third PMOS transistor having a third source connected to the compensation current source, a third gate connected to the previous input data item, and a third drain connected to the second current output transistor and forming the second output terminal, and a fourth PMOS transistor having a fourth source connected to the compensation current source, a fourth gate connected to the reference voltage, and a fourth drain connected to the first current output transistor and forming the fourth output terminal.

The first current output transistor is preferably a first NMOS transistor having a first drain and a first gate commonly connected to the first and second output terminals, and having a first source connected to a ground voltage. Similarly, the second current output transistor is preferably a second NMOS transistor having a second drain and a second gate commonly connected to the third and fourth output terminals, and having a second source connected to a ground voltage.

The unit restoring circuit may further comprise a latch circuit operating in response to a restoring clock signal, for storing and amplifying the first and second difference currents, and outputting the amplified current outputs. The latch circuit may comprise a first switching unit for transmitting first and second outputs of the first and second current output transistors in response to the restoring clock, a first latch for amplifying and storing the first and second outputs of the first and second current output transistors transmitted through the first switching unit, a second switching unit for transmitting the output of the first latch in response to an inverted clock signal of the of the restoring clock signal, and a second latch for amplifying and storing the output of the first latch transmitted through the second switching unit and outputting it as restored output data.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Figure 1:
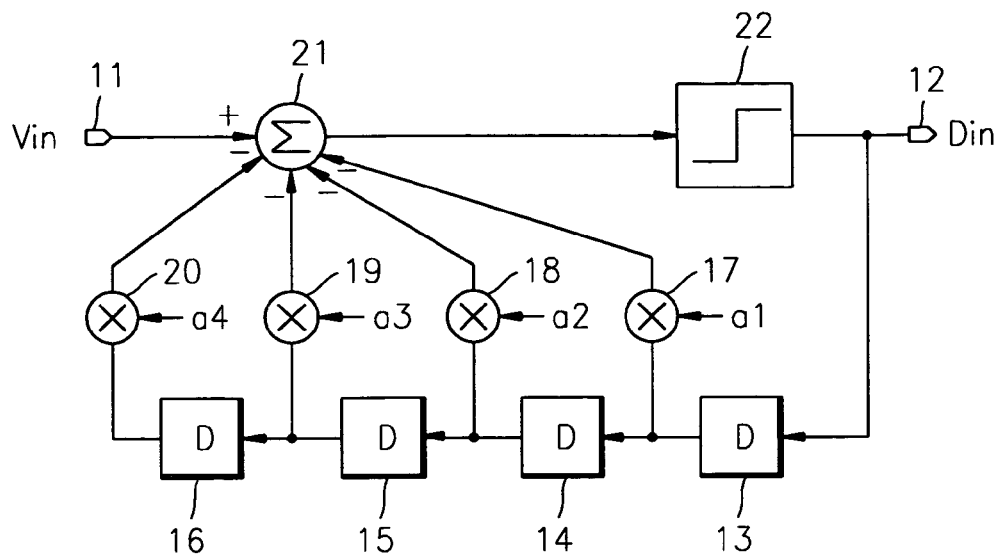
FIG. 1 is a schematic block diagram of a conventional high frequency component restoring apparatus.
Figure 2:
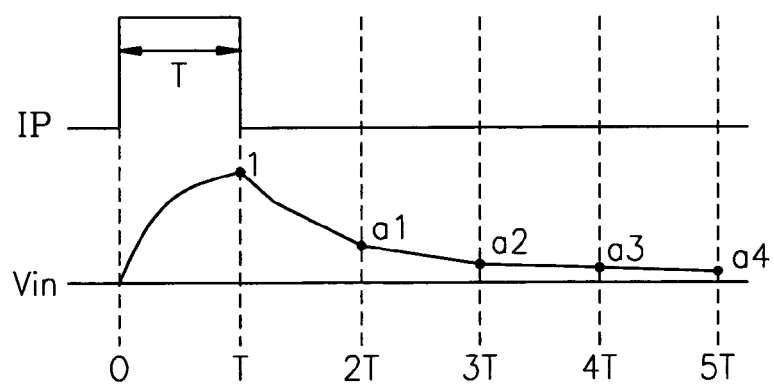
FIG. 2 is a graph showing a signal transient response characteristic of a channel for describing the high frequency component restoring apparatus shown in FIG. 1.

Preferred embodiments of the present invention will be described below in detail with reference to the attached drawings. However, it will be understood by those skilled in the art that various changes in form and details may be made to these preferred embodiments without departing from the spirit and scope of the invention. In different drawings, the same reference numerals denote the same elements.

Figure 3:
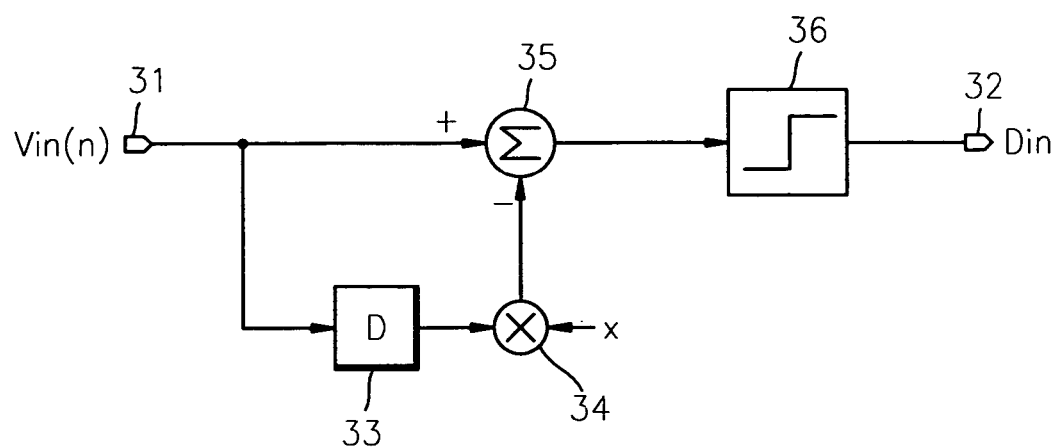
FIG. 3 is a schematic block diagram of a high frequency component restoring apparatus according to a preferred embodiment of the present invention.

Referring to FIG. 3, the high frequency component restoring apparatus according to the present invention includes an input port 31, an output port 32, a delayer 33, a multiplier 34, an adder 35, and a voltage comparator 36.

The input port 31 receives current input data $V_{in(n)}$ transmitted through a channel whose frequency bandwidth is restricted, e.g., a bus. The delayer 33 retains the input data of a previous period of time by delaying the current input data $V_{in(n)}$ by the period T of the current input data $V_{in(n)}$. The multiplier 34 obtains a fluctuation value due to the interference signal by multiplying the input data of the previous period of time, i.e., the output signal of the delayer 33, by the interference signal x of the input data of the previous period of time. The interference signal x is determined by the frequency characteristics of the channel.

The adder 35 subtracts the fluctuation value, i.e., the output signal of the multiplier 34 from the current input data $V_{in(n)}$ in order to remove the influence of the interference signal x. The voltage comparator 36 compares the output signal of the adder 35 with a predetermined value, to generate the current data whose high frequency component is restored, and so generates output data $D_{in}$. The output data $D_{in}$ is then output through the output port 32.

Figure 4:
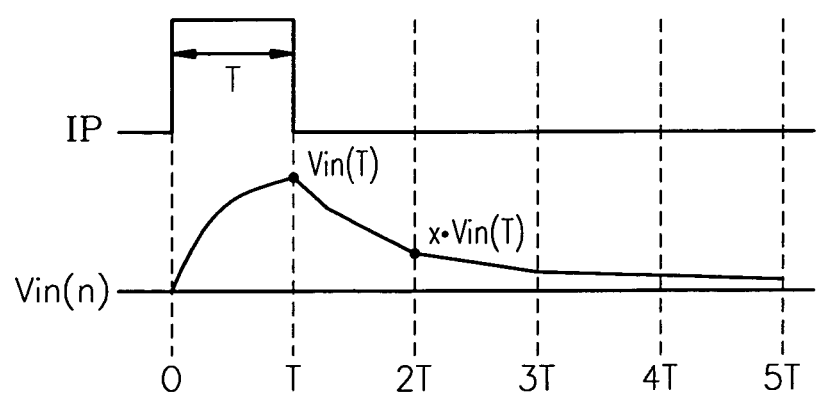
FIG. 4 is a graph showing a signal transient response characteristic of a channel for describing the high frequency component restoring apparatus shown in FIG. 3.

FIG. 4 is a graph showing a signal transient response characteristic of a channel, for describing the high frequency component restoring apparatus according to the preferred embodiment of the present invention shown in FIG. 3. The operation of the high frequency component restoring apparatus shown in FIG. 3 will be described in more detail with reference to FIG. 4.

When a predetermined pulse signal IP is transmitted through a channel whose frequency bandwidth is restricted, e.g., a bus, and is input to the input port 31, the interference signal x of input data of a previous period of time $V_{in(n-1)}$ is included in the current input data $V_{in(n)}$ input through the input port. In other words, when the input data of the previous period of time is $V_{in(T)}$ after one period T, an influence of the input data of the previous period of time, i.e., $x \cdot V_{in(T)}$, remains after 2T.

Accordingly, the interference signal x effects successive input data, i.e., the current input data $V_{in(n)}$ such that the high frequency component of the current input data $V_{in(n)}$ is lost. However, it is possible to correctly determine the successive input data, i.e., the current input data $V_{in(n)}$ and to restore the high frequency component of the current input data $V_{in(n)}$ after removing the influence of the interference signal x of the input data of the previous period of time $V_{in(n-1)}$.

Therefore, in the high frequency component restoring apparatus according to a preferred embodiment of the present invention, the fluctuation value caused by the interference signal is obtained by delaying the current input data $V_{in(n)}$ by the period T of the current input data $V_{in(n)}$, using the delayer 33 to retain the input data of the previous period of time, and multiplying the input data of the previous period of time, i.e., the output signal of the delayer 33 by the interference signal x of the input data of the previous period of time. The influence of the interference signal x is removed by subtracting the fluctuation value, i.e., the output signal of the multiplier 34, from the current input data $V_{in(n)}$ using the adder 35. Accordingly, the lost high frequency component of the current input data $V_{in(n)}$ is restored.

Figure 5:
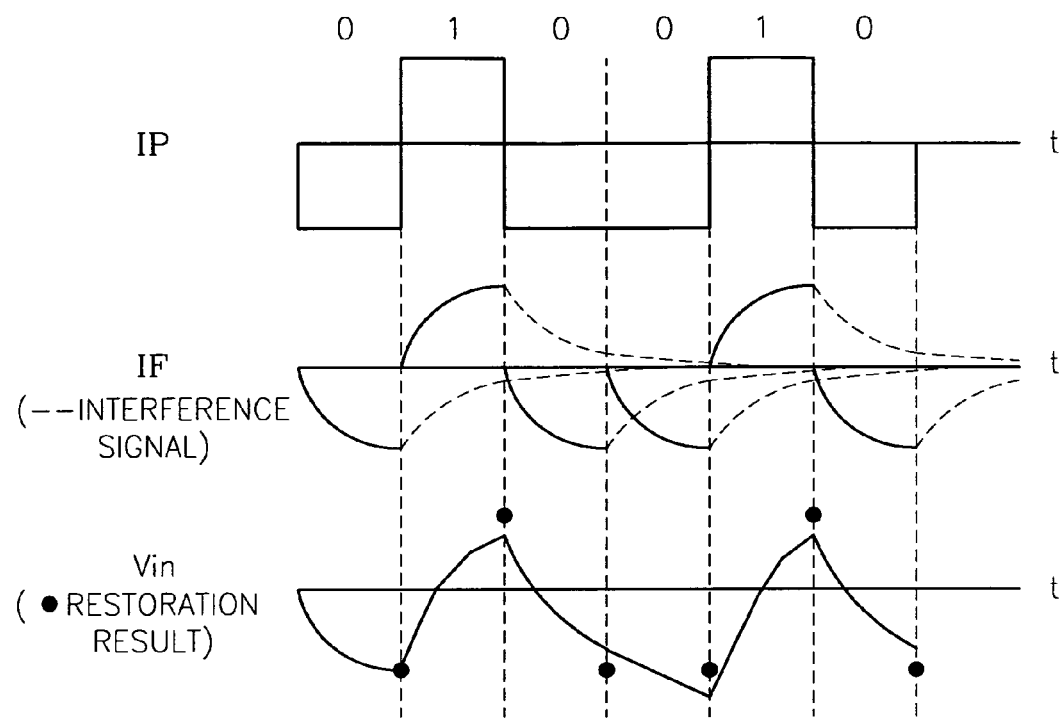
FIG. 5 shows an example of restoring an input signal using the high frequency component restoring apparatus shown in FIG. 3.

FIG. 5 shows an example of restoring an input signal using the high frequency component restoring apparatus shown in FIG. 3. Here, IP denotes a signal before being transmitted through the channel whose frequency bandwidth is restricted, and $V_{in}$ denotes a signal obtained after the signal IP has been transmitted through the channel whose frequency bandwidth is restricted and input through the input port, i.e., the input data whose high frequency component is lost. The signal IF shows the case where the interference signals (dotted lines) of the previous data items are shown together with the signal $V_{in}$. Also, the points displayed in the signal $V_{in}$ show the resulting data restored through the high frequency component restoring apparatus.

Figure 6:
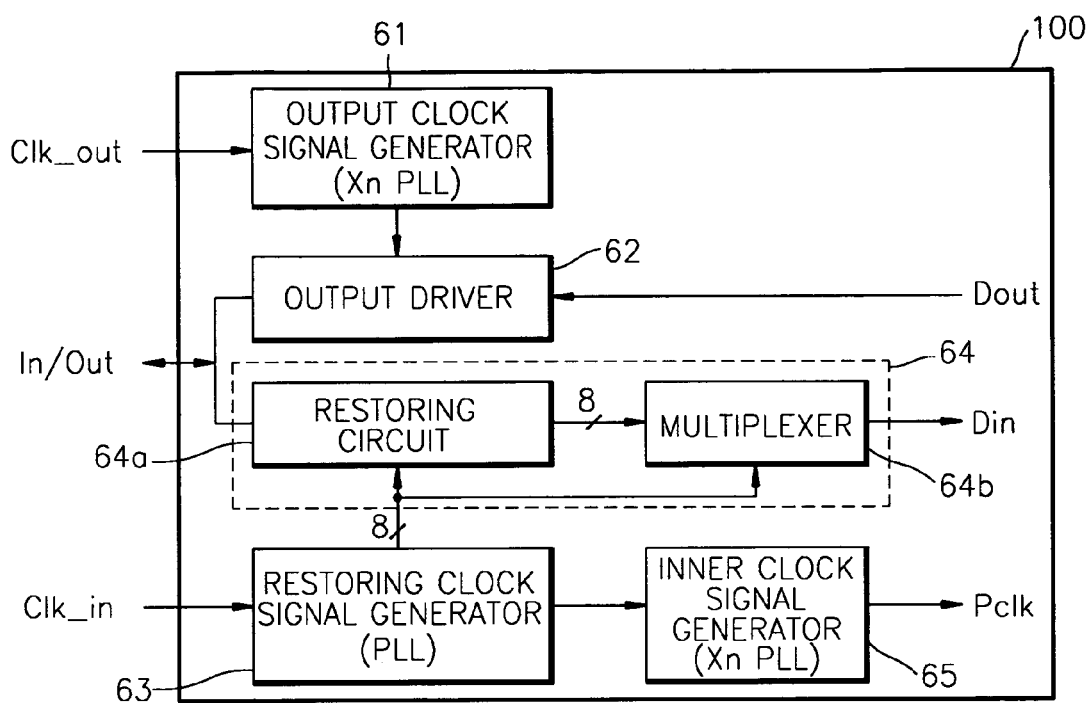
FIG. 6 is a block diagram of an input and output unit of a semiconductor device according to a preferred embodiment of the present invention, using the concept of the high frequency component restoring apparatus shown in FIG. 3.

FIG. 6 is a block diagram showing an input and output unit 100 for a semiconductor device according to a preferred embodiment of the present invention using the concept of the high frequency component restoring apparatus shown in FIG. 3. The input and output unit 100 is preferably included in the DRAM and the CPU.

Referring to FIG. 6, the preferred input and output unit 100 includes an output clock signal generator 61, an output driver 62, a restoring clock signal generator 63, a high frequency component restoring circuit (hereinafter, a high frequency equalizer) 64, and an internal clock signal generator 65.

The output clock signal generator 61 receives a first system clock signal $CLK_1$ applied from the outside of the semiconductor device during the output of data and generates an output clock signal OCLK having a frequency n times the frequency of the first system clock signal $CLK_1$ (where n is an integer). The output driver 62 synchronizes the output data $D_{out}$ from the inside of the semiconductor device with the output clock signal OCLK and outputs the output data $D_{out}$ through an input and output terminal (In/Out).

The restoring clock signal generator 63 receives a second system clock signal $CLK_2$ applied from the outside of the semiconductor device and generates a plurality of restoring clock signals $\Phi_1$ through $\Phi_4$ and $/\Phi_1$ through $/\Phi_4$ having the same frequency as the frequency of the second system clock signal $CLK_2$ and different phases from each other, e.g., a phase difference of 45. FIG. 6 shows the case where eight restoring clock signals are generated.

The high frequency equalizer 64 restores the high frequency component of the input data, which is input through the input and output terminal In/Out, and outputs the restored input data $D_{in}$ in response to the restoring clock signals $\Phi_1$ through $\Phi_4$ and $/\Phi_1$ through $/\Phi_4$.

In particular, the high frequency equalizer 64 includes a restoring circuit 64a and a multiplexer 64b. The restoring circuit 64a demultiplexes the input data, which is input through the input and output terminal In/Out, into eight separate input data, each having a time difference the same as the period of the input data. The restoring circuit 64a then restores the lost high frequency components of the eight demultiplexed input data items, and outputs the restored input data items in response to the eight restoring clock signals $\Phi_1$ through $\Phi_4$ and $/\Phi_1$ through $/\Phi_4$. The multiplexer 64b multiplexes the eight restored input items from the restoring circuit 64a and sequentially outputs the multiplexed data items one by one, in response to the restoring clock signals $\Phi_1$ through $\Phi_4$ and $/\Phi_1$ through $/\Phi_4$. The output $D_{in}$ of the multiplexer 64b is then transmitted to a proper location inside of the semiconductor device.

The internal clock signal generator 65 receives one among the restoring clock signals $\Phi_1$ through $\Phi_4$ and $/\Phi_1$ through $/\Phi_4$ and generates an internal clock signal ICLK having a frequency n times the frequency of the received restoring clock signal (where n is an integer). The internal clock signal ICLK is used for the internal circuits of the semiconductor integrated circuit.

The output clock signal generator 61, the restoring clock signal generator 63, and the internal clock signal generator 65 may be realized as general phase locked loop (PLL) circuits.

Figure 7:
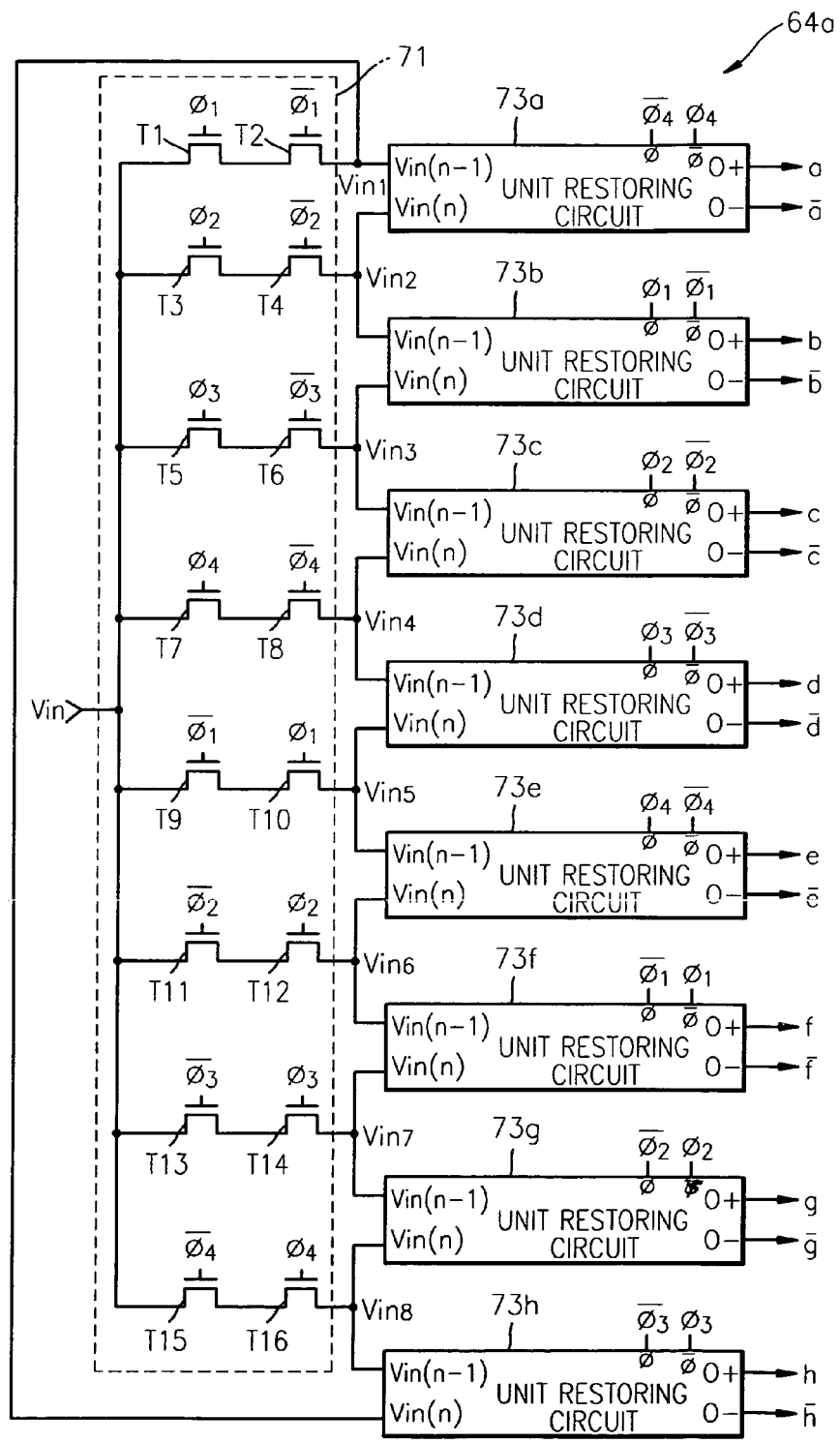
FIG. 7 is a detailed block diagram of the restoring circuit shown in FIG. 6.

FIG. 7 is a detailed block diagram of the restoring circuit 64a shown in FIG. 6.

Referring to FIG. 7, the restoring circuit includes a demultiplexer 71 and eight unit restoring circuits 73a through 73h.

The demultiplexer 71 demultiplexes the input data $V_{in}$ input received through the input and output terminal In/Out into eight input data items $V_{in1}$ through $V_{in8}$, each having a time difference the same as the period of the input data $V_{in}$, in response to the eight restoring clock signals $\Phi_1$ through $\Phi_4$ and $/\Phi_1$ through $/\Phi_4$. The demultiplexer 71 includes a plurality of switching NMOS transistor pairs between the input data $V_{in}$ and the respective demultiplexed input data items $V_{in1}$ through $V_{in8}$, i.e., sixteen switching NMOS transistors $T_1$ through $T_{16}$.

The unit restoring circuits 73a through 73h receive the current input data $V_{in(n)}$ and the input data $V_{in(n-1)}$ of the previous period of time among the eight input data $V_{in1}$ through $V_{in8}$, respectively. The unit restoring circuits 73a through 73h then restore the lost high frequency component of the current input data $V_{in(n)}$ and output the restored input data as output data 0+ and 0− in response to a corresponding restoring clock signal. For example, the unit restoring circuit 73a receives the input data $V_{in2}$ as the current input data $V_{in(n)}$, receives the input data $V_{in1}$ as the input data of the previous period of time $V_{in(n-1)}$, restores the lost high frequency component of the input data $V_{in2}$, and outputs the restored input data as output data a and /a. The unit restoring circuits 73b through 73h perform the same operation as the operation of the unit restoring circuit 73a.

To be more specific, when input data $V_{in}$ of a predetermined transmission speed, e.g., 1 Gb/s (gigabit per second), is input through the input and output terminal In/Out, the eight unit restoring circuits 73a through 73h are sequentially operated by eight 125 Mhz restoring clock signals $\Phi_1$ through $\Phi_4$ and $/\Phi_1$ through $/\Phi_4$ each having a time difference the same as the period of the input data $V_{in}$, i.e., 1 ns (nanosecond), and output respective output data. The output data items a and /a through h and /h of the unit restoring circuits 73a through 73h are converted into serial data of 1 Gb/s through the multiplexer 64b shown in FIG. 6 and are then output one by one.

Figure 8:
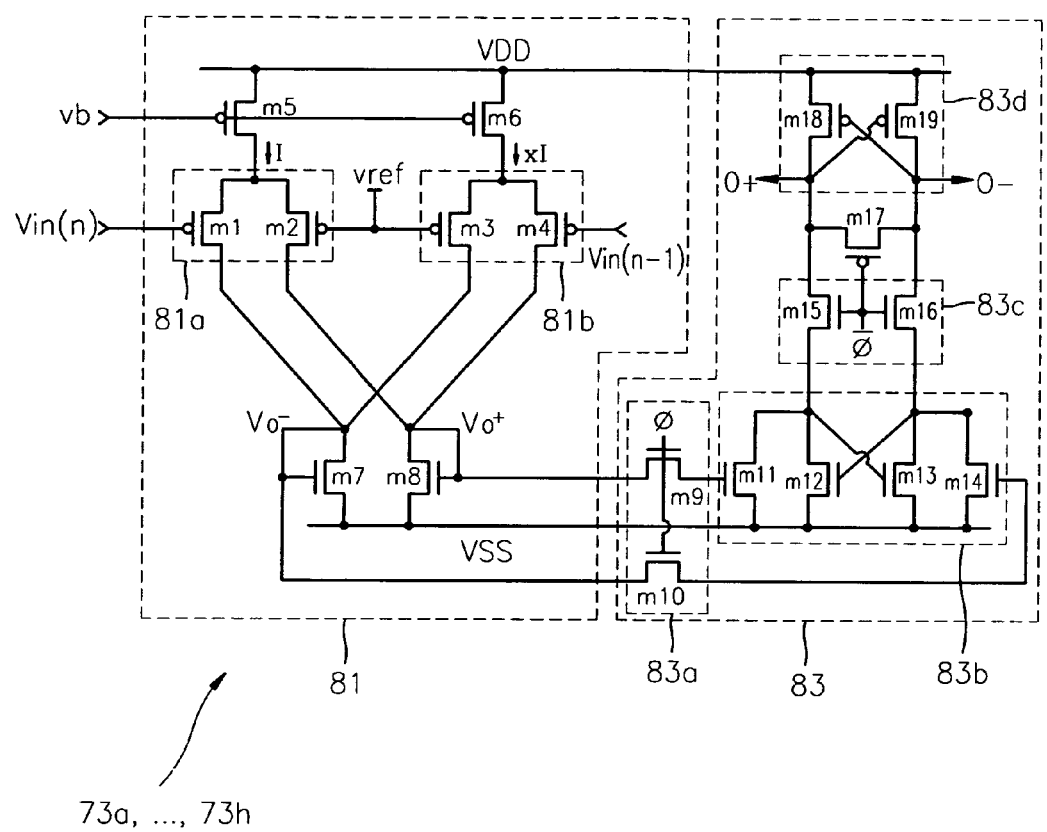
FIG. 8 is a detailed circuit diagram of the unit restoring circuit shown in FIG. 7.

FIG. 8 is a detailed circuit diagram of one of the unit restoring circuits 73a through 73h shown in FIG. 7.

Referring to FIG. 8, the unit restoring circuit includes a restoring cell 81 for receiving the current input data $V_{in(n)}$ and the input data of the previous period of time $V_{in(n-1)}$ and restoring the lost high frequency component of the current input data, and a latch circuit 83 for storing and amplifying output voltages $V_o-$ and $V_o+$ of the restoring cell 81 and outputting the output data 0− and 0+ in response to a corresponding restoring clock signal.

The restoring cell 81 includes a current source $m_5$, a compensation current source $m_6$, a first current amplifying circuit 81a, a second current amplifying circuit 81b, a first current output transistor $m_7$, and a second current output transistor $m_8$.

The current source $m_5$ preferably comprises a fifth PMOS transistor. In this case, a supply voltage $V_{DD}$ is applied to the source of the current source $M_5$, a control signal $V_b$ is applied to the gate of the current source $M_5$, and the drain of the current source $M_5$ is connected to the first current amplifying circuit 81a. The control signal $V_b$ is preferably a predetermined and fixed bias voltage.

The compensation current source $M_6$ preferably comprises a sixth PMOS transistor. In this case, the supply voltage $V_{DD}$ is applied to the source of the current source $M_6$, the control signal $V_b$ is applied to the gate of the current source $M_6$, and the drain of the current source $M_6$ is connected to the second current amplifying circuit 81b.

In particular, the circuit is preferably designed such that a current I flows from the current source $m_5$ and that current (x·I) flows from the compensation current source $m_6$. The value x is designed to have the same magnitude as the interference signal x of the input data of the previous period of time $V_{in(n-1)}$. In other words, $$1/x = \frac{W_{M5}}{L_{M5}} / \frac{W_{M6}}{L_{M6}}, \text{ or} \tag{1}$$

$$x = \frac{W_{M6}}{W_{M5}} \cdot \frac{L_{M5}}{L_{M6}} \tag{2}$$

where $W_{M5}$ is the width of the current source $M_5$, $L_{M5}$ is the length of the current source $M_5$, $W_{M6}$ is the width of the current source $M_6$, and $L_{M6}$ is the length of the current source $M_6$.

The first current amplifying circuit 81a amplifies the current I provided from the current source $m_5$ in response to the current input data $V_{in(n)}$ and a reference voltage $V_{ref}$. The first current amplifying circuit 81a preferably comprises a first PMOS transistor $m_1$ and a second PMOS transistor $M_2$. In this case, the source of the PMOS transistor $m_1$ is connected to the current source $m_5$, the current input data $V_{in(n)}$ is applied to the gate of the PMOS transistor $m_1$, and the drain of the PMOS transistor $m_1$ is connected to the first current output transistor $m_7$. The source of the second PMOS transistor $m_2$ is connected to the current source $m_5$, the gate of the second PMOS transistor $M_2$ is connected to the reference voltage $V_{ref}$, and the drain of the second PMOS transistor $M_2$ is connected to the second current output transistor $m_8$.

The second current amplifying circuit 81b also amplifies the current (x·I) supplied by the compensation current source $m_6$ in response to the input data of the previous period of time $V_{in(n-1)}$ and the reference voltage $V_{ref}$. The second current amplifying circuit 81b includes a fourth PMOS transistor $m_4$ and a third PMOS transistor $M_3$. The source of the fourth PMOS transistor $m_4$ is connected to the compensation current source $m_6$, the input data of the previous period of time $V_{in(n-1)}$ is applied to the gate of the fourth PMOS transistor $m_4$, and the drain of the fourth PMOS transistor $m_4$ is connected to the second current output transistor $m_8$. The source of the third PMOS transistor $m_3$ is connected to the compensation current source $m_6$, the reference voltage $V_{ref}$ is applied to a gate of the third PMOS transistor $M_3$, and the drain of the third PMOS transistor is connected to the first current output transistor $m_7$.

The first current output transistor $m_7$ preferably comprises an NMOS transistor. The drain and the gate of the output transistor $m_7$ are commonly connected to the drain of the first PMOS transistor $m_1$ of the first current amplifying circuit 81a and to the drain of the third PMOS transistor $m_3$ of the second current amplifying circuit 81b, and the source of the output transistor $m_7$ is grounded to a voltage $V_{SS}$. The first current output transistor $m_7$ outputs a current proportional to the difference between the current that flows to the drain of the fourth PMOS transistor $m_1$ and the current that flows to the drain of the fourth PMOS transistor $m_4$, and outputs an output voltage $V_o-$ corresponding to the output current.

The second current output transistor $m_8$ also preferably comprises an NMOS transistor. The drain and the gate of the output transistor $m_8$ are commonly connected to the drain of the second PMOS transistor $m_2$ of the first current amplifying circuit 81a and to the drain of the fourth PMOS transistor $m_4$ of the second current amplifying circuit 81b, and the source of the output transistor $m_8$ is grounded to the voltage $V_{SS}$. The second current output transistor $m_8$ outputs a current proportional to the difference between the current that flows to the drain of the second PMOS transistor $m_2$ and the current that flows to the drain of the PMOS transistor $m_3$, and outputs an output voltage $V_o+$ corresponding to the output current.

The latch circuit 83 includes a first switching unit 83a, a first latch 83b, a second switching unit 83c, a second latch 83d, and an equalization PMOS transistor m $_7$. The first switching unit 83a connects or disconnects the output voltages $V_o-$ and $V_o+$ of the restoring cell 81 to the first latch 83b in response to the corresponding restoring clock signal Φ. The first latch 83b amplifies and stores the outputs $V_o-$ and $V_o+$ transmitted through the first switching unit 83a. The second switching unit 83c connects or disconnects the output of the first latch 83b to the second latch 83d in response to the inverted clock signal /Φ of the restoring clock signal, a second latch 83d for amplifying and storing the output of the first latch transmitted through the second switching unit 83c and outputting the output data 0− and 0+, and an equalization PMOS transistor $m_{17}$ for equalizing the output ports of the second switching unit 83c.

Preferably, the first switching unit 83a includes ninth and tenth NMOS transistors $m_9$ and $m_{10}$; the first latch 83b includes eleventh through fourteenth NMOS transistors $m_{11}$ through $m_{14}$; the second switching unit 83c includes fifteenth and sixteenth NMOS transistors $m_{15}$ and $m_{16}$; and the second latch 83d preferably comprises eighteenth and nineteenth PMOS transistors $m_{18}$ and $m_{19}$.

The operation of the unit restoring circuit will now be described in more detail with reference to FIG. 8. It is assumed that the reference voltage $V_{ref}$ is 0 volts, and the current $I_{d8}$ that flows to the drain of the second current output transistor $m_8$ is expressed as follows.

$$I_{d8} = gm_2 \cdot V_{in(n)} - gm_4 \cdot V_{in(n-1)} \quad (3)$$

where $gm_2$ and $gm_4$ represent the transconductance of the second and fourth PMOS transistor $m_2$ and $m_4$, respectively. When the magnitude of $gm_4$ is designed to be equal to the magnitude of $(x \cdot gm_2)$, equation (3) is simplified as follows.

$$I_{d8} = gm_2 \{V_{in(n)} - x \cdot V_{in(n-1)}\} \quad (4)$$

where x has the same magnitude as the magnitude of the interference signal of the input data of the previous period of time $V_{in(n-1)}$.

Therefore, an amount of current proportional to the value obtained by subtracting the product of x and the input data of the previous period of time $V_{in(n-1)}$ from the current input data $V_{in(n)}$, flows through the second current output transistor $m_8$. Since the unit restoring circuit has a full differential type, current whose direction is opposite to the direction of the current of the second current output transistor $m_8$ and whose magnitude is the same as the magnitude of the current of the second current output transistor $m_8$ flows through the first current output transistor $m_7$. As a result of this, differential output voltages $V_o-$ and $V_o+$ are shown at the drain of the first current output transistor $m_7$ and the drain of the second current output transistor $m_8$. Since the voltage levels of the output voltages $V_o-$ and $V_o+$ are small, the voltage levels of the output voltages $V_o-$ and $V_o+$ are then converted into a CMOS level by the latch circuit 83, and the converted output data 0− and 0+ are finally output.

Figure 9:
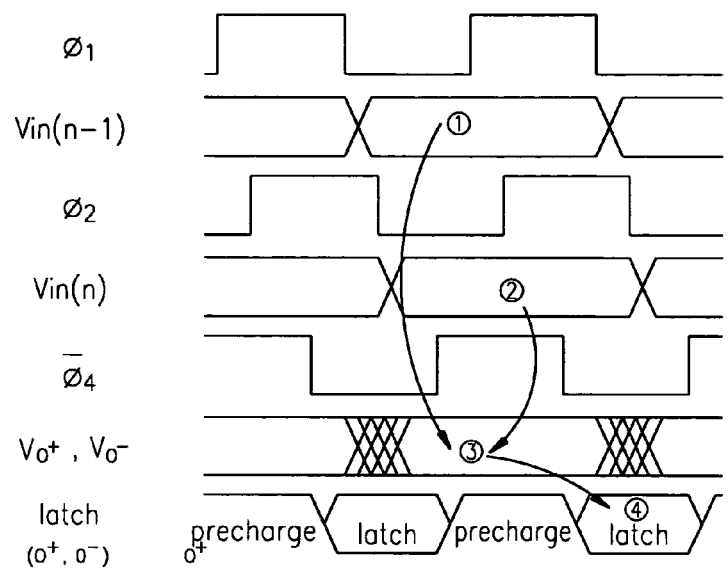
FIG. 9 is a timing diagram of the operation of the uppermost unit restoring circuit among the unit restoring circuits shown in FIG. 7.

FIG. 9 is a timing diagram showing the operation of the unit restoring circuit 73a located in the uppermost part among the unit restoring circuits shown in FIG. 7.

Figure 10:
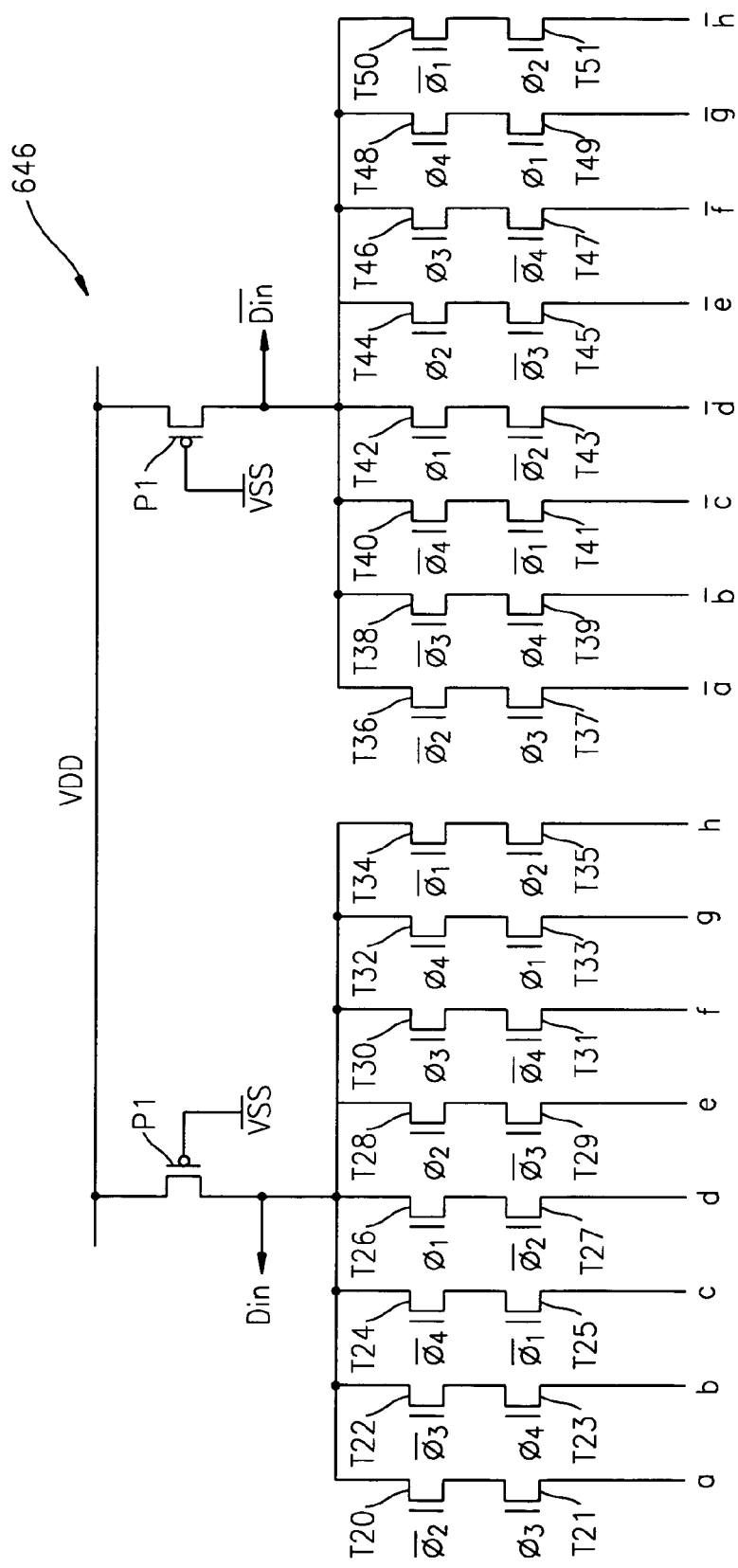
FIG. 10 is a detailed circuit diagram of the multiplexer shown in FIG. 6.

FIG. 10 is a detailed circuit diagram of the multiplexer shown in FIG. 6.

Referring to FIG. 10, the multiplexer preferably includes sixteen switching NMOS transistors $T_{20}$ through $T_{35}$, which are serially connected in pairs between the output $D_{in}$ and the output data items a through h of the respective unit restoring circuits, sixteen switching NMOS transistors $T_{36}$ through $T_{51}$, which are serially connected in pairs between the complementary output $/D_{in}$ of the output $D_{in}$ and the complementary output data /a through /h of the respective unit restoring circuits, and precharge PMOS transistors $P_1$ and $P_2$.

The multiplexer multiplexes the output data a through h and the complementary output data /a through /h, and sequentially outputs the data items as the output $D_{in}$ and the complementary output $/D_{in}$ one by one, in response to the restoring clock signals $\Phi_1$ through $\Phi_4$ and $/\Phi_1$ through $/\Phi_4$. The output $D_{in}$ and the complementary output $/D_{in}$ are then transmitted to the inside of the semiconductor device.

Figure 11:
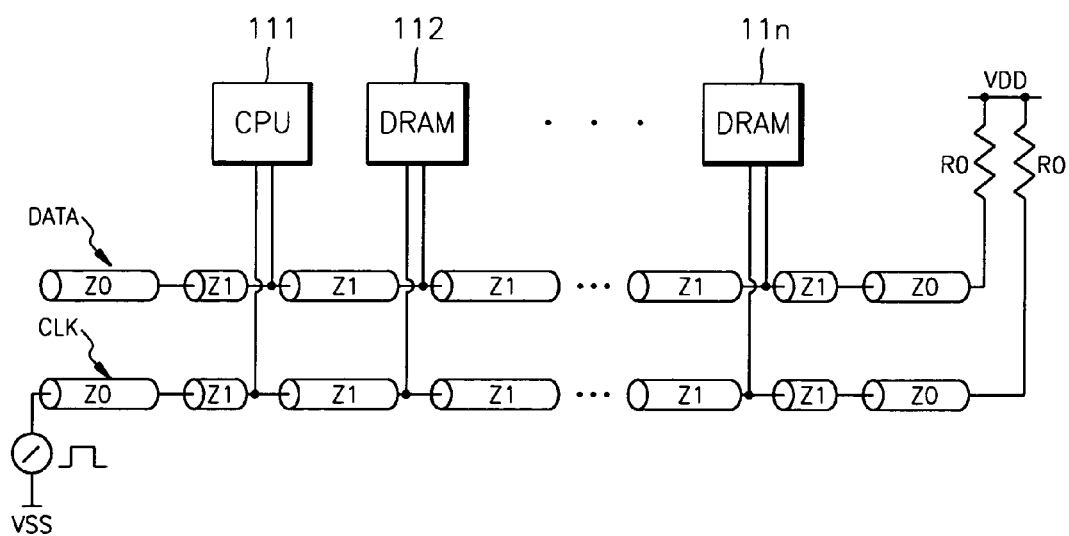
FIG. 11 is a circuit diagram used for a simulation experiment for verifying the effect of the semiconductor device according to a preferred embodiment of the present invention, as shown in FIG. 6.

FIG. 11 is a circuit diagram used for a simulation experiment for verifying the effect of the semiconductor device according to the preferred embodiment of the present invention shown in FIG. 6.

Referring to FIG. 11, a CPU 111 and 32 DRAMs 112, through 112n are connected to a data bus DATA and a clock signal bus CLK. The CPU 111 and the 32 DRAMs 112, through 112n include the input and output unit shown in FIG. 6. During the simulation experiment, the CPU 111 outputs data to the data bus DATA. The data is then transmitted through the data bus DATA. The DRAM 112n, which is the last among the DRAMs 112, through 112n, receives the transmitted data. The input and output pin of the DRAM is modeled by a load having a capacitance of 4 pF and an inductance of 5 nH. The matching resistance $R_0$ is assumed to 50 Ω. $Z_0$ and $Z_1$ respectively denote the characteristic impedances of the data bus DATA and the clock signal bus CLK.

Figure 12A:
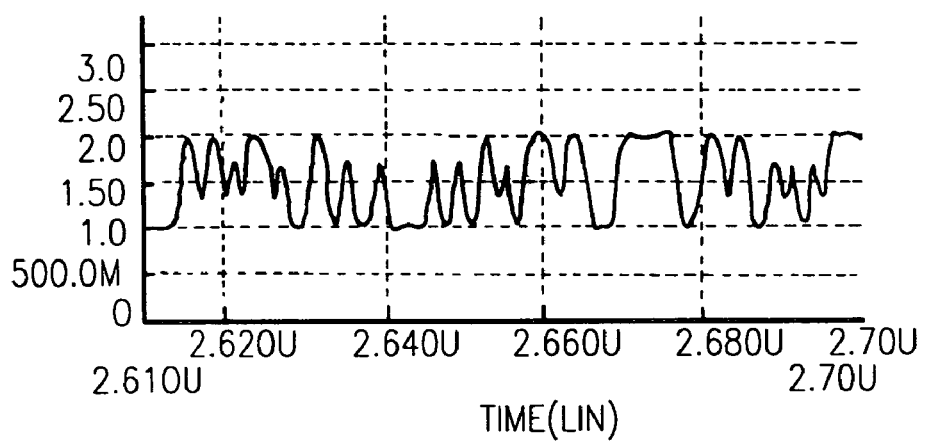
FIGS. 12A and 12B show a result of designing the semiconductor device according to a preferred embodiment of the present invention using the commonly-used 0.35-m design rule CMOS process parameter, and performing a simulation experiment according to the circuit shown in FIG. 11.
Figure 12B:
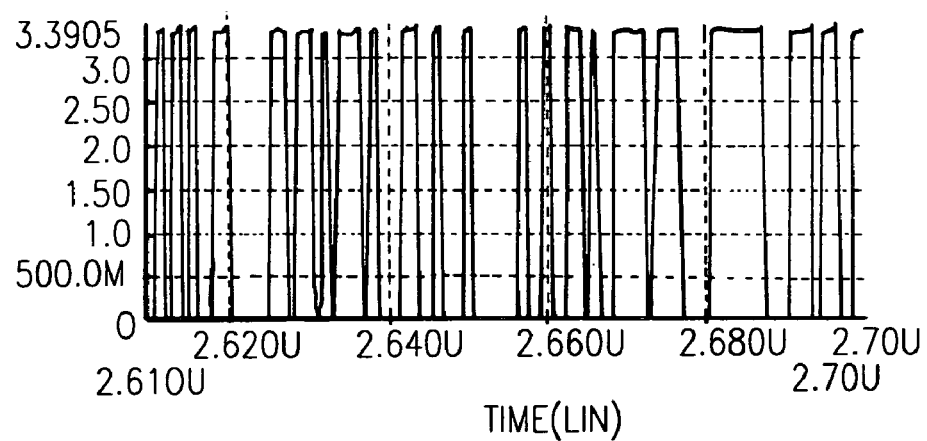

FIGS. 12A and 12B show results from a simulation experiment performed according to the circuit diagram shown in FIG. 11, employing a commonly-used 0.35-m design rule CMOS process parameter. FIG. 12A shows the waveform of data on the data bus DATA when the CPU 111 transmits data through the data bus DATA at a data transmission speed of 1 Gb/s. FIG. 12B shows the waveform of the result restored by the DRAM 112n.

Referring to FIG. 12A, the high frequency component of the data on the data bus DATA is lost due to the load of the data bus DATA. Referring to FIG. 12B, the lost high frequency component is correctly restored by the DRAM 112n, which is a receiver.

As mentioned above, the high frequency equalizer according to the present invention demultiplexes the input data input through the input and output terminal into a plurality of input data items, each having a time difference that is the same as the period of the input data. The equalizer restores the lost data components of the demultiplexed input data items, demultiplexes the plurality of restored data items, and sequentially outputs the multiplexed data items one by one. Therefore, in the high frequency equalizer according to the present invention, it is possible to allow enough time for restoring the lost high frequency component even though the period of the input data is reduced by the increase of the data transmission speed. In the high frequency equalizer according to the present invention, it is thus possible to correctly restore the lost high frequency component even at a high data transmission speed. Therefore, using this high frequency equalizer, the lost high frequency component of data can be restored even at a high data transmission speed.

What is claimed is:

1. A semiconductor device, comprising:
   an output clock signal generator for receiving a first system clock signal and generating an output clock signal having a frequency n times the frequency of the first system clock signal, where n in an integer;
   an output driver for synchronizing output data with the output clock signal and outputting the synchronized output data through an input and output terminal;
   a restoring clock signal generator for receiving a second system clock signal and generating a plurality of restoring clock signals having the same frequency as the frequency of the second system clock signal and each having different phases; and
   a high frequency equalizer for restoring lost high frequency components of input data input through the input and output terminal in response to the restoring clock signals and outputting the restored input data.

2. A semiconductor device, as recited in claim 1, wherein the output clock signal generator comprises a phase locked loop circuit.

3. A semiconductor device, as recited in claim 1, wherein the restoring clock signal generator comprises a PLL circuit.

4. A semiconductor, as recited in claim 1, wherein the high frequency equalizer comprises:
   a restoring circuit operating in response to the restoring clock signals, for demultiplexing the input data into a plurality of input data items each having a time difference the same as a period of the input data, restoring the lost high frequency components of the plurality of demultiplexed input data items, and outputting the restored input data items; and
   a multiplexer operating in response to the restoring clock signals, for multiplexing the restored input data items of the restoring circuit and sequentially outputting the multiplexed data items one by one as restored input data.

5. A semiconductor device, as recited in claim 4, wherein the restoring circuit comprises:
   a demultiplexer for demultiplexing the input data into the plurality of input data items; and
   a plurality of unit restoring circuits, each operating to receive a current input data item of a current period of time and a previous input data item of a previous period of time from among the plurality of input data items, restoring the lost high frequency component of the current input data item to form a restored input data item, and outputting the restored input item in response to a corresponding one of the restoring clock signals.

6. A semiconductor device, as recited in claim 5, wherein each of the unit restoring circuits comprises:
   a restoring cell for receiving the current input data item the previous input data item and restoring the lost high frequency component of the current input data to form an intermediate input data item; and
   a latch circuit operating in response to the corresponding restoring clock signal, for storing and amplifying the intermediate input data item, and outputting the amplified intermediate input data item as the restored input data item.

7. A semiconductor device, as recited in claim 6, wherein the restoring cell comprises:

a regular current source for supplying a first source current;
a compensation current source for providing a second source current;
a first current amplifying circuit for amplifying the first source current in response to the current input data item and a reference voltage;
a second current amplifying circuit for amplifying the second source current in response to the previous input data item and the reference voltage;
a first current output transistor commonly connected to a first output terminal of the first current amplifying circuit and a second output terminal of the second current amplifying circuit, for outputting a first comparison current proportional to the difference between the currents output from the first and second output terminals; and
a second current output transistor commonly connected to a third output terminal of the first current amplifying circuit and a fourth output terminal of the second current amplifying circuit, for outputting a second comparison current proportional to the difference between the currents output from the third and fourth output terminals.

8. A semiconductor deice, as recited in claim 7, wherein the second source current is equal to the first source current times an interference signal of the previous input data item.

9. A semiconductor device, as recited in claim 6, wherein the latch circuit comprises:
   a first switching unit for transmitting the output of the restoring cell in response to the corresponding restoring clock signal;
   a first latch for amplifying and storing the output of the restoring cell transmitted through the first switching unit as a first stored data item;
   a second switching unit for transmitting the first stored data item in response to an inverted clock signal of the corresponding restoring clock signal; and
   a second latch for amplifying and storing the first stored data item transmitted through the second switching unit as a second stored data item, and outputting the second stored data item as the restored input data item.

10. A semiconductor device, as recited in claim 1, further comprising an inner clock signal generator for receiving one of the plurality of restoring clock signals and generating an internal clock signal having a frequency equal to m times the frequency of the received restoring clock signal, wherein m is an integer.

11. A high frequency equalizer, comprising:
    a restoring circuit for demultiplexing input data into a plurality of input data items each having a time difference the same as period of the input data, restoring lost high frequency components of the plurality of demultiplexed input data items, and outputting restored input data items in response to restoring clock signals; and
    a multiplexer for multiplexing the restored input data items and sequentially outputting multiplexed data items one by one as restored input data, in response to the restoring clock signals;
    wherein the restoring circuit comprises:
    a demultiplexer for demultiplexing the input data into the plurality of input data items in response to the restoring clock signals; and
    a plurality of unit restoring circuits operating in response to the corresponding restoring clock signals, for receiving current input data items of a current time and previous input data of a previous period of time, restoring the lost high frequency component of the current input data item, and outputting restored input data items;

wherein the unit restoring circuit comprises:

a restoring cell for receiving the current input data item and the previous input data item and restoring the lost high frequency component of the current input data item to form an intermediate input data item; and a latch circuit for storing and amplifying the intermediate input data item in response to the corresponding restoring clock signal and outputting the amplified intermediate data item as a restored input data item.

12. A high frequency equalizer, as recited in claim 11, wherein the restoring cell comprises:

a regular current source for supplying a first source current;

a compensation current source for providing a second source current;

a first current amplifying circuit for amplifying the first source current in response to the current input data item and a reference voltage;

a second current amplifying circuit for amplifying the second source current in response to the previous input data item and the reference voltage;

a first current output transistor commonly connected to a first output terminal of the first current amplification circuit and to a second output terminal of the second current amplification circuit, for outputting a current proportional to the difference between the currents output first and second output terminals; and a second current output transistor commonly connected to a third output terminal of the first current amplifying circuit and a fourth output terminal of the second current amplifying circuit, for outputting a current proportional to the difference between the currents output from the third and fourth output terminals.

13. A high frequency equalizer, as recited in claim 11, wherein the latch circuit comprises:

a first switching unit for transmitting the intermediate data item from the restoring cell in response to the corresponding restoring clock signal;

a first latch for amplifying and storing the intermediate input data item as a first stored data item;

a second switching unit for transmitting the first stored data item in response to an inverted clock signal of the corresponding restoring clock signal; and a second latch for amplifying and storing the first stored data item as a second stored data item, and outputting the second stored data item as a restored input data item.

14. A unit restoring circuit, comprising:

a regular current source for supplying a first source current;

a compensation current source for providing second source current;

a first current amplifying circuit for amplifying the first source current in response to a current input data item and a reference voltage;

a second current amplifying circuit for amplifying the second source current in response to a previous input data item and the reference voltage;

a firs current output transistor commonly connected to a first output terminal of the first current amplifying circuit and a second output terminal of the second current amplifying circuit, for outputting a first difference current proportional to the difference between the currents output from the first and second output terminals; and a second current output transistor commonly connected to a third output terminal of the first current amplifying circuit and a fourth output terminal of the second current amplifying circuit, for outputting a second difference current proportional to the difference between the currents output from the third and fourth output terminals.

15. A unit restoring circuit, as recited in claim 14, wherein the first current amplifying circuit comprises:

a first PMOS transistor having a first source connected to the current source, a first gate connected to the current input data item, and a first drain connected to the first current output transistor and forming the first output terminal; and a second PMOS transistor having a second source connected to the current source, a second gate connected to the reference voltage, and a second drain connected to the second current output transistor and forming the third output terminal.

16. A unit restoring circuit, as recited in claim 14, wherein the second current amplifying circuit comprises:

a third PMOS transistor having a third source connected to the compensation current source, a third gate connected to the previous input data item, and a third drain connected to the second current output transistor and forming the second output terminal; and a fourth PMOS transistor having a fourth source connected to the compensation current source, a fourth gate connected to the reference voltage, and a fourth drain connected to the first current output transistor and forming the fourth output terminal.

17. A unit restoring circuit, a recited in claim 14, wherein the first current output transistor is a first NMOS transistor having a first drain and a first gate commonly connected to the first and second output terminals, and having a first source connected to a ground voltage.

18. A unit restoring circuit, as recited in claim 14, wherein the second current output transistor is a second NMOS transistor having a second drain and a second gate commonly connected to the third and fourth output terminals, and having a second source connected to a ground voltage.

19. A unit restoring circuit, as recited in claim 14, further comprising a latch circuit operating in response to a restoring clock signal, for storing and amplifying the first and second difference currents, and outputting the amplified current outputs.

20. A unit restoring circuit, as recited in claim 19, wherein the latch circuit comprises:

a first switching unit for transmitting first and second outputs of the first and second current output transistors in response to the restoring clock;

a first latch for amplifying and storing the first and second outputs of the first and second current output transistors transmitted through the first switching unit;

a second switching unit for transmitting the output of the first latch in response to an inverted clock signal of the of the restoring clock signal; and a second latch for amplifying and storing the output of the first latch transmitted through the second switching unit and outputting it as restored output data.

* * * * *